United States Patent
Chen et al.

(10) Patent No.: US 10,458,823 B2
(45) Date of Patent: Oct. 29, 2019

(54) SYSTEM AND METHOD FOR HEALTH MONITORING AND EARLY WARNING FOR ELECTRONIC DEVICE

(71) Applicant: Fifth Electronics Research Institute of Ministry of Industry and Information Technology, Guangzhou (CN)

(72) Inventors: Yiqiang Chen, Guangzhou (CN); Yun Huang, Guangzhou (CN); Dengyun Lei, Guangzhou (CN); Yudong Lu, Guangzhou (CN); Yunfei En, Guangzhou (CN); Chunhua He, Guangzhou (CN); Liwei Wang, Guangzhou (CN)

(73) Assignee: Fifth Electronics Research Institute of Ministry of Industry and Information Technology (CN)

( * ) Notice: Subject to any disclaimer, the term of this patent is extended or adjusted under 35 U.S.C. 154(b) by 0 days.

(21) Appl. No.: 15/556,702

(22) PCT Filed: Nov. 29, 2016

(86) PCT No.: PCT/CN2016/107704
§ 371 (c)(1),
(2) Date: Sep. 8, 2017

(87) PCT Pub. No.: WO2018/028086
PCT Pub. Date: Feb. 15, 2018

(65) Prior Publication Data
US 2019/0154475 A1    May 23, 2019

(30) Foreign Application Priority Data
Aug. 12, 2016    (CN) .......................... 2016 1 0665494

(51) Int. Cl.
*G01D 21/02*    (2006.01)
*G01R 31/28*    (2006.01)
*G01R 31/00*    (2006.01)

(52) U.S. Cl.
CPC ............. *G01D 21/02* (2013.01); *G01R 31/00* (2013.01); *G01R 31/2801* (2013.01); *G01R 31/2817* (2013.01)

(58) Field of Classification Search
CPC . G01D 21/02; G01R 31/2801; G01R 31/2817
(Continued)

(56) References Cited

U.S. PATENT DOCUMENTS

2014/0324389 A1* 10/2014 Baldwin ................ G01D 9/005
702/187
2018/0032064 A1*  2/2018 Fang ........................ A61B 6/02

FOREIGN PATENT DOCUMENTS

| CN | 101825894 A | 9/2010 |
| CN | 101963937 A | 2/2011 |

(Continued)

OTHER PUBLICATIONS

International Search Report for Application No. PCT/CN2016/107704 dated May 24, 2017, 5 pages.
(Continued)

*Primary Examiner* — Melissa J Koval
*Assistant Examiner* — Trung Nguyen
(74) *Attorney, Agent, or Firm* — Lerner, David, Littenberg, Krumholz & Mentlik, LLP

(57) ABSTRACT

The present disclosure relates to a system and method for health monitoring and early warning for an electronic device. A sensor is used to monitor a physical parameter of a circuit board of a host electronic system of the electronic device to acquire sensor data, and transmit the acquired sensor data to an embedded control device. The sensor data
(Continued)

includes at least one of current data, vibration data, temperature data and voltage data. The embedded control device is used to extract a feature from the sensor data to acquire feature data, and perform real-time analysis and prediction based on the feature data to obtain and display a prediction result. In this way, the user can be provided with real-time health monitoring and real-time prediction information for the host electronic system circuit board.

8 Claims, 2 Drawing Sheets

(58) Field of Classification Search
USPC ............. 324/600, 713, 500–521, 522, 750.3, 324/764.01, 718, 115, 76.11, 234, 239, 324/200
See application file for complete search history.

(56) References Cited

FOREIGN PATENT DOCUMENTS

| | | |
|---|---|---|
| CN | 102156245 A | 8/2011 |
| CN | 102316496 A | 1/2012 |
| CN | 103019916 A | 4/2013 |
| CN | 103176486 A | 6/2013 |
| CN | 204177480 U | 2/2015 |
| JP | 2008039492 A | 2/2008 |

OTHER PUBLICATIONS

Chinese Search Report for Application No. 201610665494.4 dated Jul. 4, 2017, 2 pages.

* cited by examiner

SYSTEM AND METHOD FOR HEALTH MONITORING AND EARLY WARNING FOR ELECTRONIC DEVICE

CROSS REFERENCE TO RELATED APPLICATIONS

The present application is a national phase entry under 35 U.S.C. § 371 of International Application No. PCT/CN2016/107704, filed Nov. 29, 2016, which claims priority from Chinese Patent Application No. 201610665494.4 filed Aug. 12, 2016, all of which are hereby incorporated herein by reference.

FIELD

The present disclosure relates to the technical field of failure prediction, and more particularly, to a system and method for health monitoring and early warning for an electronic device.

BACKGROUND

The technology of prognostics and health management (PHM) can use as few sensors as possible to collect various data information in a system, and use an intelligent reasoning algorithm to evaluate the health condition of the system, so as to predict a failure to happen in the system before the failure practically happens, and to provide maintenance and supporting measures to achieve condition-based maintenance based on information on available resources. The PHM system can achieve the transition from traditional sensor-based diagnostic to prediction based on intelligent system, which greatly facilitates the progress of replacing breakdown maintenance and preventive maintenance with condition-based maintenance. PHM system can determine the possibility of failure in current state and the possibility of failure in the next period of time timely and accurately, and makes assistant decision-making advices for usage and maintenance.

The traditional failure early warning method is to use an early warning circuit to output a warning signal when a failure is caused by a key failure mechanism for integrated circuit. Specifically, reference data may be stored in a reference device; a stress supplying device may input a parameter into the an input pin of an integrated circuit for testing, and detect an output pin of the integrated circuit to acquire test data; and an early warning signal may be output by comparing the test data and the reference data with a comparison circuit. The traditional failure early warning method needs to input the parameter into at least one pin of the integrated circuit and also needs to collect data from at least one pin of the integrated circuit, so it is only applicable for failure early warning for CMOS integrated circuits, and is unable to predict a failure for an electronic device.

SUMMARY

Based on the above, an objective of the present disclosure is to provide a system and method for health monitoring and early warning for an electronic device.

A system for health monitoring and early warning for an electronic device is provided, including a sensor arranged in the electronic device, and an embedded control device coupled to the sensor.

The sensor is configured to monitor a physical parameter of a circuit board of a host electronic system of the electronic device to acquire sensor data, and transmit the acquired sensor data to the embedded control device, the sensor data including at least one of current data, vibration data, temperature data and voltage data.

The embedded control device is configured to extract a feature from the sensor data to acquire feature data, and perform real-time analysis and prediction based on the feature data to obtain and display a prediction result.

A method for health monitoring and early warning for an electronic device is provided, including:

monitoring, by a sensor, a physical parameter of a circuit board of a host electronic system of the electronic device to acquire sensor data, and transmitting the acquired sensor data to an embedded control device, the sensor data including at least one of current data, vibration data, temperature data and voltage data;

extracting, by the embedded control device, a feature from the sensor data to acquire feature data; and performing, by the embedded control device, real-time analysis and prediction based on the feature data to obtain and display a prediction result.

For the above system and method for health monitoring and early warning for an electronic device, a sensor is used to monitor a physical parameter of a circuit board of a host electronic system of the electronic device to acquire sensor data, and transmit the acquired sensor data to an embedded control device. The sensor data includes at least one of current data, vibration data, temperature data and voltage data. The embedded control device is used to extract a feature from the sensor data to acquire feature data, and perform real-time analysis and prediction based on the feature data to obtain and display a prediction result. In this way, the user can be provided with real-time health monitoring and real-time prediction information for the host electronic system circuit board. The process of the performance degradation of the electronic device can be monitored in real-time, and the tendency the performance degradation of the electronic device can be predicted in real-time, to achieve the functions of failure prediction and health management of the electronic device.

DETAILED DESCRIPTION

Figure 1:
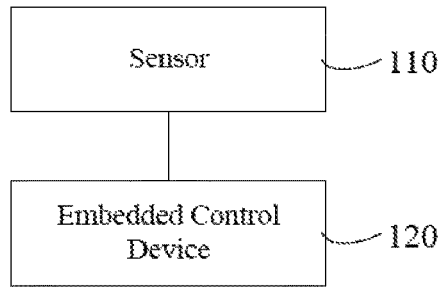
FIG. 1 is a structure diagram illustrating a system for health monitoring and early warning for an electronic device according to one embodiment of the present disclosure.

In one embodiment, a system for health monitoring and early warning for an electronic device is provided, shown in FIG. 1. The system includes a sensor 110 and an embedded control device 120. The sensor 110 is arranged in the electronic device, and the embedded control device 120 is coupled to the sensor 110.

The sensor 110 is configured to monitor a physical parameter of a circuit board of a host electronic system of the electronic device to acquire sensor data, and transmit the acquired sensor data to the embedded control device 120.

There are no limitations to the numbers and types of the sensors 110; that is, there may be one or more sensors, or there may be one or more types of sensors. The types of the sensor data are different based on the different types of sensors. The sensor data may include at least one of current data, vibration data, temperature data and voltage data. The required physical parameter can be monitored by designing the layout of the sensor 110 on the host electronic system circuit board. In this embodiment, the sensor 110 includes a current sensor, a vibration sensor, a temperature sensor and a voltage sensor coupled to the embedded control device 120, which are for respectively monitoring the host electronic system circuit board respectively. The acquired sensor data includes current data, vibration data, temperature data and voltage data accordingly. Meanwhile, four physical parameters of the host electronic system circuit board are acquired and transmitted to the embedded control device 120 for health prediction, to make sure that the prediction result is more accordant with the actual situation, and to improve the accuracy of the prediction. It will be appreciated that the type of sensor 110 is not limited to the above four types, but may also include other types of embeddable sensors.

The embedded control device 120 is configured to extract a feature from the sensor data to acquire feature data, and perform real-time analysis and prediction based on the feature data, so as to obtain and display a prediction result.

Feature data of a feature can be extracted from the sensor data to represent a physical condition of the circuit board of the host electronic system, and to facilitate the subsequent health prediction. The embedded control device 120 may perform feature extraction on the sensor data in many ways. For example, the feature extraction may be performed on the same type of sensor data acquired at different positions of the circuit board of the host electronic system at the same time, so as to obtain the feature data. For another example, the feature extraction may be performed on the same type of sensor data acquired at the same position of the circuit board of the host electronic system at different times, to obtain the feature data. There may be varying types of feature data, including a mean value and a mean square deviation.

For example, the sensor data includes the temperature data, and the feature data includes the mean value. A plurality of temperature sensors may be used to monitor the temperature of different positions of the circuit board of the host electronic system simultaneously, and the temperature data acquired at the different positions at the same time may be used to calculate the mean value, as the feature data. Alternatively, one temperature sensor may be used to monitor the temperature of a same position of the circuit board of the host electronic system frequently, the temperature data acquired at multiple acquisition cycles may be used to calculate the mean value, as the feature data.

There may be many types of embedded control devices 120. For example, the embedded control devices 120 may be an SoPC embedded control device or an SoC embedded control device. In this embodiment, the embedded control device 120 is an SoPC embedded device that integrates a processor, a memory, I/O (input/output) ports and other functional modules required by the user into a device, to create a system on a programmable chip (SoPC). The SoPC embedded device is flexible in design, which may be cut down, expanded or upgraded, and have a hardware and software system programmable capability.

Figure 2:
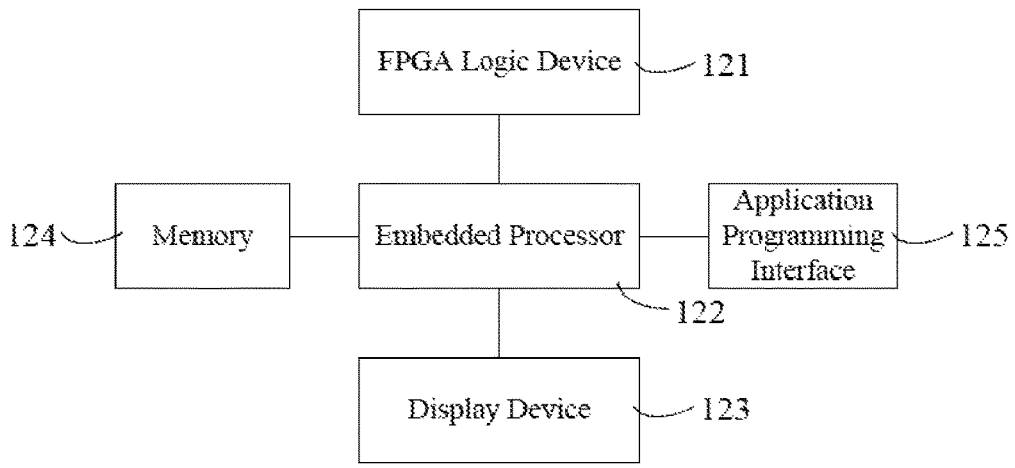
FIG. 2 is structure diagram illustrating an embedded control device according to one embodiment of the present disclosure.

In one embodiment, as shown in FIG. 2, the embedded control device 120 includes an FPGA (Field-Programmable Gate Array) logic device 121, an embedded processor 122 and a display device 123. The FPGA logic device 121 is coupled to the sensor 110, and the embedded processor 122 is coupled to the FPGA logic device 121 and the display device 123 respectively.

The embedded processor 122 is configured to acquire the sensor data output from the sensor 110 through the FPGA logic device 121, extract the feature from the sensor data to acquire the feature data, perform the real-time analysis and the prediction based on the feature data to obtain the prediction result, and transmit the prediction result to the display device 123 for displaying.

In addition, the embedded control device 120 further includes a memory 124 and an application programming interface 125 coupled to the embedded processor 122 respectively. The memory 124 is used to store sensor data, the prediction result and other data. The application programming interface 125 is used to provide an access interface for application, so as to facilitate the development and access of the application and improve the convenience of the operation.

In particular, the FPGA logic device 121 may be an FPGA logic device with a soft core or a hard core. The embedded processor 122 has a built-in kernel layer, a built-in service layer and a built-in application layer. The kernel layer includes an operating system kernel and a sensor drive program. In this embodiment, the operating system kernel is an SoPC-oriented operating system kernel, and the sensor drive program is used to drive the sensor in combination with the operating system kernel. The service layer includes a data-driven prediction algorithm model and an application programming interface, and the data-driven prediction algorithm model is used to acquire the sensor data based on the interface provided by the operating system kernel, perform the feature extraction on the sensor data, and perform real-time analysis and prediction on the feature data. The application layer includes a failure prediction and health management APP (Application) and an access APP. The failure prediction and health management APP is used to transmit the prediction result to the display device 123 for displaying, to provide the user with the real-time health monitoring and real-time prediction information for the circuit board of the host electronic system. The operator can access the application programming interface provided by the service layer through the access APP, to design the operating system kernel, sensor drive program, data driven predictive model and the failure prediction and health management APP.

The sensor 110 may acquire the sensor data in real time. The acquired sensor data may be transmitted through the FPGA logic device 121, the sensor drive program in the kernel layer, and the operating system kernel. The feature extraction may be performed on the sensor data based on the data driven predictive model in the service layer. The real-time prediction may be performed on the feature data with the prediction algorithm to obtain a prediction result. The prediction result may be displayed by the failure prediction and health management APP in the application layer, to provide the user with the real-time health monitoring and real-time prediction information for the circuit board of the host electronic system.

The embedded control device 120 performs the real-time analysis and prediction based on the feature data; there is no limitation to the specific ways of obtaining the prediction result. That is, any algorithm with a predication function may be used for analysis and prediction. In particular, the real-time analysis and prediction may be performed by extended Kalman filter, unscented Kalman filter and particle filter algorithm, all of which are based on Kalman filter.

Given that there are N measured output data $y_1, y_2, \ldots, y_N$, the system state $x_{N+p}$ after p steps may be predicted. The filtering means:

$$\hat{x}_{k|k} = E(x_k|y^k) \to x_k, y^k = \{y_i\}_{i=1}^k, k=1,2,\ldots,N.$$

The one-step prediction and the two-step prediction are respectively as below:

$$\hat{x}_{k+1|k} = E(x_{k+1}|y^k) \to x_{k+1}, \hat{x}_{k+2|k} = E(x_{k+2}|y^k) \to x_{k+2},$$

where $y^k = \{y_i\}_{i=1}^k$. For the convenience, it may abbreviated to $\hat{x}_k = \hat{x}_{k|k}$, $\hat{x}_k' = \hat{x}_{k+1|k}$.

Specifically, for a linear stochastic systems, $$\begin{cases} x_{k+1} = Ax_k + w_k \\ y_k = Cx_k + v_k \end{cases}$$

where A and C are preset matrixes, $w_k$ is an irrelevant process noise with a mean value of 0 and a variance of $Q$, $v_k$ is an irrelevant measurement noise with a mean value of 0 and a variance of R, and $w_k$, $v_k$ are irrelevant to each other.

In this embodiment, the embedded control device performs the real-time analysis and prediction based on the feature data with the Kalman prediction algorithm, including:

filtering the feature data with Kalman filter to obtain filtered data, as follows:

$$\hat{x}_k' = A\hat{x}_{k-1},$$

$$P_k' = AP_{k-1}A^T + Q,$$

$$K_k = P_k'C^T(CP_k'C^T + R)^{-1},$$

$$\hat{x}_k = \hat{x}_k' + K_k(y_k - C\hat{x}_k'),$$

$$P_k = P_k' - K_kCP_k'.$$

where $k=1, 2, \ldots, N$, N is a number of the feature data, $P_0$ and $\hat{x}_0$ are known, A and C are preset matrixes, $A^T$ and $C^T$ are transposed matrixs of A and C respectively, $Q$ and R are variances of irrelative process noise and irrelevant measurement noise respectively, $y_k$ is the feature data, and $\hat{x}_k$ is the filtered data; and performing Kalman prediction based on the filtered data to obtain the prediction result, as follow:

$$\hat{x}_{N+k|N} = A\hat{x}_{N+k-1|N}, k=1,2,\ldots,p$$

where $\hat{x}_{N+1|N} = A\hat{x}_N$, $\hat{x}_N$ is the filtered data, $\hat{x}_{N+k|N}$ represents a prediction result at a k-th step, N is the number of feature data, and p is a number of prediction steps.

For the above system for health monitoring and early warning for an electronic device, a sensor 110 is used to monitor a physical parameter of a circuit board of a host electronic system of the electronic device to acquire sensor data, and transmit the acquired sensor data to an embedded control device 120, wherein the sensor data includes at least one of current data, vibration data, temperature data and voltage data. The embedded control device 120 is used to extract a feature from the sensor data to acquire feature data, and perform real-time analysis and prediction based on the feature data to obtain and display a prediction result. In this way, the user can be provided with real-time health monitoring and real-time prediction information for the host electronic system circuit board. The process of the performance degradation of the electronic device can be monitored in real-time, and the tendency the performance degradation of the electronic device can be predicted in real-time, to achieve the functions of failure prediction and health management of the electronic device.

Figure 3:
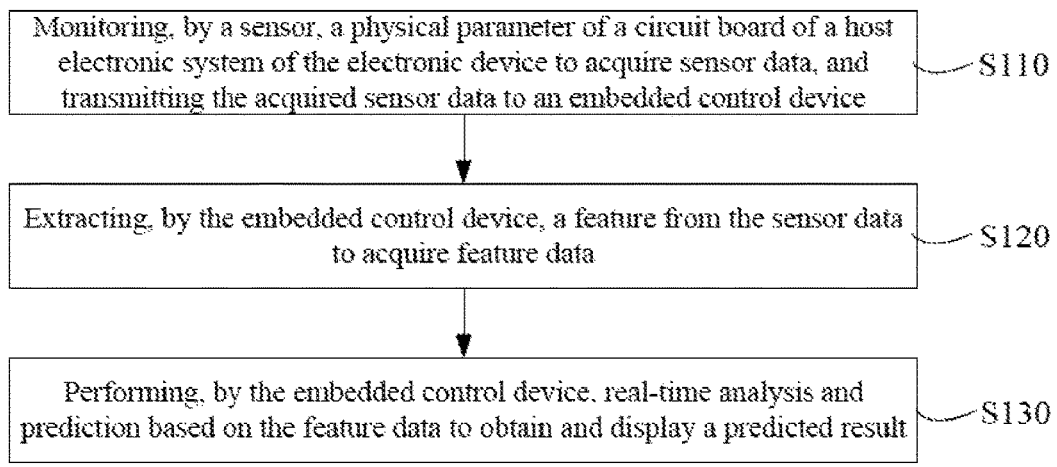
FIG. 3 is a flow diagram illustrating processes of a method for health monitoring and early warning for an electronic device according to one embodiment of the present disclosure.

In one embodiment, a method for health monitoring and early warning for an electronic device based on the above system for health monitoring and early warning for an electronic device is provided. As shown in FIG. 3, the method includes the following steps.

In step S110, the sensor may monitor a physical parameter of a circuit board of a host electronic system of the electronic device to acquire sensor data, and transmit acquired sensor data to the embedded control device.

The sensor is arranged in the electronic device. There are no limitations to the number and types of sensors; that is, there may be one or more sensors, or there may be one or more types of sensors. The types of the sensor data are different based on the different types of sensors. The sensor data may include at least one of current data, vibration data, temperature data and voltage data. The required physical parameter can be monitored by designing the layout of the sensor on the host electronic system circuit board. In this embodiment, the sensor includes a current sensor, a vibration sensor, a temperature sensor and a voltage sensor coupled to the embedded control device, which are for monitoring the host electronic system circuit board respectively. The acquired sensor data includes current data, vibration data, temperature data and voltage data accordingly. Meanwhile, four physical parameters of the host electronic system circuit board are acquired and transmitted to the embedded control device for health prediction, to make sure that the prediction result is more accordant with the actual situation, and to improve the accuracy of the prediction. It will be appreciated that the type of sensor is not limited to the above four types, but may also include other types of embeddable sensors.

In step S120, the embedded control device may extract a feature from the sensor data to acquire feature data.

Feature data of a feature can be extracted from the sensor data to represent a physical condition of the circuit board of the host electronic system, to facilitate the subsequent health prediction. The feature extraction may be performed on the sensor data in many ways. For example, the feature extraction may be performed on the same type of sensor data acquired at different positions of the circuit board of the host electronic system at the same time, to obtain the feature data. For another example, the feature extraction may be performed on the same type of sensor data acquired at the same position of the circuit board of the host electronic system at different times, to obtain the feature data. There may be varying types of feature data, including a mean value and a mean square deviation. There may be many types of embedded control devices 120. For example, the embedded control devices 120 may be a SoPC embedded control device or a SoC embedded control device.

In step S130, the embedded control device may perform the real-time analysis and prediction based on the feature data to obtain and display a prediction result.

Figure 4:
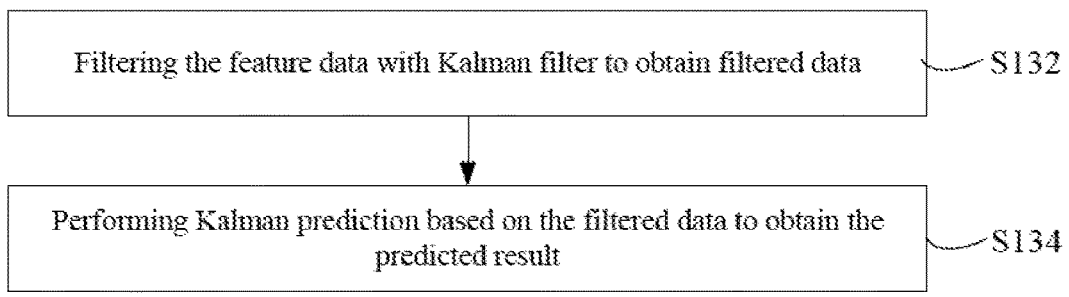
FIG. 4 is a flow diagram illustrating a process of performing real-time analysis and prediction by an embedded control device based on feature data to obtain a prediction result according to one embodiment of the present disclosure.

There may be many ways for the embedded control device 120 to perform the real-time analysis and prediction based on the feature data, to obtain the prediction result. In particular, the real-time analysis and prediction may be performed by extended Kalman filter, unscented Kalman filter and particle filter algorithm, all of which are based on Kalman filter. In this embodiment, as shown in FIG. 4, in step S130, the real-time analysis and prediction is performed based on the feature data with the Kalman prediction algorithm, including step S132 and step S134.

In step S132, the feature data is filtered with the Kalman filter to obtain the filtered data, as follows:

$$\hat{x}_k' = A\hat{x}_{k-1},$$

$$P_k' = AP_{k-1}A^T + Q,$$

$$K_k = P_k'C^T(CP_k'C^T + R)^{-1},$$

$$\hat{x}_k = \hat{x}_k' + K_k(y_k - C\hat{x}_k'),$$

$$P_k = P_k' - K_k CP_k'.$$

where k=1, 2, ..., N, N is a number of the feature data, $P_0$ and $\hat{x}_0$ are known, A and C are preset matrixes, $A^T$ and $C^T$ are transposed matrixs of A and C respectively, $Q$ and R are variances of irrelative process noise and irrelevant measurement noise respectively, $y_k$ is the feature data, and $\hat{x}_k$ is the filtered data.

In step S134, Kalman prediction is performed based on the filtered data to obtain the prediction result, as follow:

$$\hat{x}_{N+k|N} = A\hat{x}_{N+k-1|N}, \ k=1,2,\ldots,p$$

where $\hat{x}_{N+1|N} = A\hat{x}_N$, $\hat{x}_N$ is the filtered data, $\hat{x}_{N+k|N}$ represents a prediction result at a k-th step, N is the number of feature data, and p is a number of prediction steps.

For the above method for health monitoring and early warning for an electronic device, a sensor is used to monitor a physical parameter of a circuit board of a host electronic system of the electronic device to acquire sensor data, and transmit the acquired sensor data to an embedded control device, wherein the sensor data includes at least one of current data, vibration data, temperature data and voltage data; and the embedded control device is used to extract a feature from the sensor data to acquire feature data, and perform real-time analysis and prediction based on the feature data to obtain and display a prediction result. In this way, the user can be provided with real-time health monitoring and real-time prediction information for the host electronic system circuit board. The process of the performance degradation of the electronic device can be monitored in real-time, and the tendency the performance degradation of the electronic device can be predicted in real-time, to achieve the functions of failure prediction and health management of the electronic device.

The technical features in the embodiments above may be implemented in any combination. For the purpose of simplicity, not all combinations are described herein. However, such combination should all be considered within the scope of the present disclosure provide that there is no contradiction.

The detailed embodiments described herein are only for the purpose of illustrating the present disclosure, and are not intended to limit the scope of the present disclosure in any way. It would be understand by a person skilled in the art that various changes and modifications can be made to the embodiments described herein without departing from the scope and spirit of the present disclosure. Such changes and modifications are contemplated by the present disclosure, the scope of which should only be defined by the following claims.

What is claimed is:

1. A system for health monitoring and early warning for an electronic device, comprising:
   a sensor arranged in the electronic device; and
   an embedded control device coupled to the sensor,
   wherein sensor is configured to monitor a physical parameter of a circuit board of a host electronic system of the electronic device to acquire sensor data, and transmit acquired sensor data to the embedded control device, the sensor data including at least one of current data, vibration data, temperature data and voltage data,
   wherein the embedded control device is configured to extract a feature from the sensor data to acquire a feature data, and perform real-time analysis and prediction based on the feature data to obtain and display a prediction result; and
   wherein the embedded control device further performs real-time analysis and prediction based on the feature data to obtain the prediction result comprises:
   filtering the feature data with Kalman filter to obtain filtered data, as follows:

$$\hat{x}_k' = A\hat{x}_{k-1},$$

$$P_k' = AP_{k-1}A^T + Q,$$

$$K_k = P_k'C^T(CP_k'C^T + R)^{-1},$$

$$\hat{x}_k = \hat{x}_k' + K_k(y_k - C\hat{x}_k'),$$

$$P_k = P_k' - K_k CP_k',$$

where k=1, 2, ..., N, N is a number of the feature data, $P_0$ and $\hat{x}_0$ are known, A and C are preset matrixes, $A^T$ and $C^T$ are transposed matrixes of A and C respectively, Q and R are variances of irrelative process noise and irrelevant measurement noise respectively, $y_k$ is the feature data, and $\hat{x}_k$ is the filtered data; and
   performing Kalman prediction based on the filtered data to obtain the prediction result, as follow:

$$\hat{x}_{N+k|N} = A\hat{x}_{N+k-1|N}, \ k=1,2,\ldots,p$$

where $\hat{x}_{N+1|N} = A\hat{x}_N$, $\hat{x}_N$ is the filtered data, $\hat{x}_{N+k|N}$ represents a prediction result at a k-th step, N is the number of feature data, and p is a number of prediction steps.

2. The system of claim 1, wherein the sensor includes a current sensor, a vibration sensor, a temperature sensor and a voltage sensor coupled to the embedded control device.

3. The system of claim 1, wherein the embedded control device includes an FPGA logic device, an embedded processor and a display device, the FPGA logic device is coupled to the sensor, and the embedded processor is coupled to the FPGA logic device and the display device respectively; and
   the embedded processor is configured to acquire the sensor data output from the sensor through the FPGA logic device, extract the feature from the sensor data to acquire the feature data, perform the real-time analysis and the prediction based on the feature data to obtain the prediction result, and transmit the prediction result to the display device for displaying.

4. The system of claim 3, wherein the embedded control device further includes a memory and an application programming interface coupled to the embedded processor respectively.

5. The system of claim 1, wherein the embedded control device is an SoPC embedded control device or an SoC embedded control device.

6. A method for health monitoring and early warning for an electronic device, comprising:

monitoring, by a sensor, a physical parameter of a circuit board of a host electronic system of the electronic device to acquire sensor data, and transmitting acquired sensor data to an embedded control device, the sensor data including at least one of current data, vibration data, temperature data and voltage data;

extracting, by the embedded control device, a feature from the sensor data to acquire feature data;

performing, by the embedded control device, real-time analysis and prediction based on the feature data to obtain and display a prediction result; and wherein the performing, by the embedded control device, real-time analysis and prediction based on the feature data to obtain the prediction result comprises:

filtering the feature data with Kalman filter to obtain filtered data, as follows:

$$\hat{x}_k' = A\hat{x}_{k-1},$$

$$P_k' = AP_{k-1}A^T + Q,$$

$$K_k = P_k'C^T(CP_k'C^T + R)^{-1},$$

$$\hat{x}_k = \hat{x}_k' + K_k(y_k - C\hat{x}_k'),$$

$$P_k = P_k' - K_k CP_k',$$

where k=1, 2, ..., N, N is a number of the feature data, $P_0$ and $\hat{x}_0$ are known, A and C are preset matrixes, $A^T$ and $C^T$ are transposed matrixes of A and C respectively, Q and R are variances of irrelative process noise and irrelevant measurement noise respectively, $y_k$ is the feature data, and $\hat{x}_k$ is the filtered data; and performing Kalman prediction based on the filtered data to obtain the prediction result, as follow:

$$\hat{x}_{N+k|N} = A\hat{x}_{N+k-1|N}, k=1,2,\ldots,p$$

where $\hat{x}_{N+1|N} = A\hat{x}_N$, $\hat{x}_N$ is the filtered data, $\hat{x}_{N+k|N}$ represents a prediction result at a k-th step, N is the number of feature data, and p is a number of prediction steps.

7. The method of claim 6, wherein the sensor includes a current sensor, a vibration sensor, a temperature sensor and a voltage sensor.

8. The method of claim 6, wherein the feature data includes a mean value or a mean square deviation.

* * * * *